United States Patent [19]

Laskaris et al.

[11] Patent Number: 5,677,630
[45] Date of Patent: Oct. 14, 1997

[54] PLANAR SUPERCONDUCTING MRI MAGNET

[75] Inventors: Evangelos Trifon Laskaris, Schenectady; Michele Dollar Ogle, Burnt Hills, both of N.Y.

[73] Assignee: General Electric Company, Schenectady, N.Y.

[21] Appl. No.: 734,572

[22] Filed: Oct. 21, 1996

[51] Int. Cl.$^6$ .................................................. G01V 3/00
[52] U.S. Cl. .................................... 324/320; 324/319
[58] Field of Search ........................... 324/320, 319, 324/318; 335/216, 299; 505/704, 705

[56] References Cited

U.S. PATENT DOCUMENTS

| | | |
|---|---|---|
| 4,500,860 | 2/1985 | Vermilyea . |
| 4,506,247 | 3/1985 | Vermilyea . |
| 4,509,030 | 4/1985 | Vermilyea . |
| 4,523,166 | 6/1985 | Gross . |
| 4,581,580 | 4/1986 | Keim . |
| 4,721,914 | 1/1988 | Fukushima et al. ............ 324/320 |
| 4,724,412 | 2/1988 | Kalafala . |
| 4,875,485 | 10/1989 | Matsutani . |
| 4,924,198 | 5/1990 | Laskaris . |
| 4,986,078 | 1/1991 | Laskaris . |
| 5,006,804 | 4/1991 | Dorri et al. . |
| 5,117,188 | 5/1992 | Ohkawa . |
| 5,291,169 | 3/1994 | Ige et al. . |
| 5,331,282 | 7/1994 | McDougall et al. ........... 324/320 |
| 5,359,310 | 10/1994 | Pissanetzky . |
| 5,410,287 | 4/1995 | Laskaris et al. . |
| 5,428,292 | 6/1995 | Dorri et al. . |
| 5,570,073 | 10/1996 | Muller ............................ 324/320 |
| 5,596,303 | 1/1997 | Akgun et al. ................... 324/320 |

OTHER PUBLICATIONS

HARC (Houston Advanced Research Center), Sales Brochure entitled "Introducing New Technology for MRI Magnets with Uprecedented Patient Access", 1992.

Primary Examiner—Louis M. Arana
Attorney, Agent, or Firm—Douglas E. Erickson; Marvin Snyder

[57] ABSTRACT

A planar magnetic resonance imaging (MRI) magnet having a superconductive coil assembly including a toroidal-shaped coil housing which surrounds a bore, has a longitudinal axis, and contains at least three concentric, annular-shaped superconductive coils coaxially aligned with the axis. The coils produce a magnetic resonance imaging volume having a center located outside the bore. Preferably, the bore is generally completely filled with magnetic material, and the magnetic resonance imaging volume is located completely outside the bore which provides for improved patient and physician access during MRI-guided biopsy as well as during MRI imaging.

18 Claims, 1 Drawing Sheet

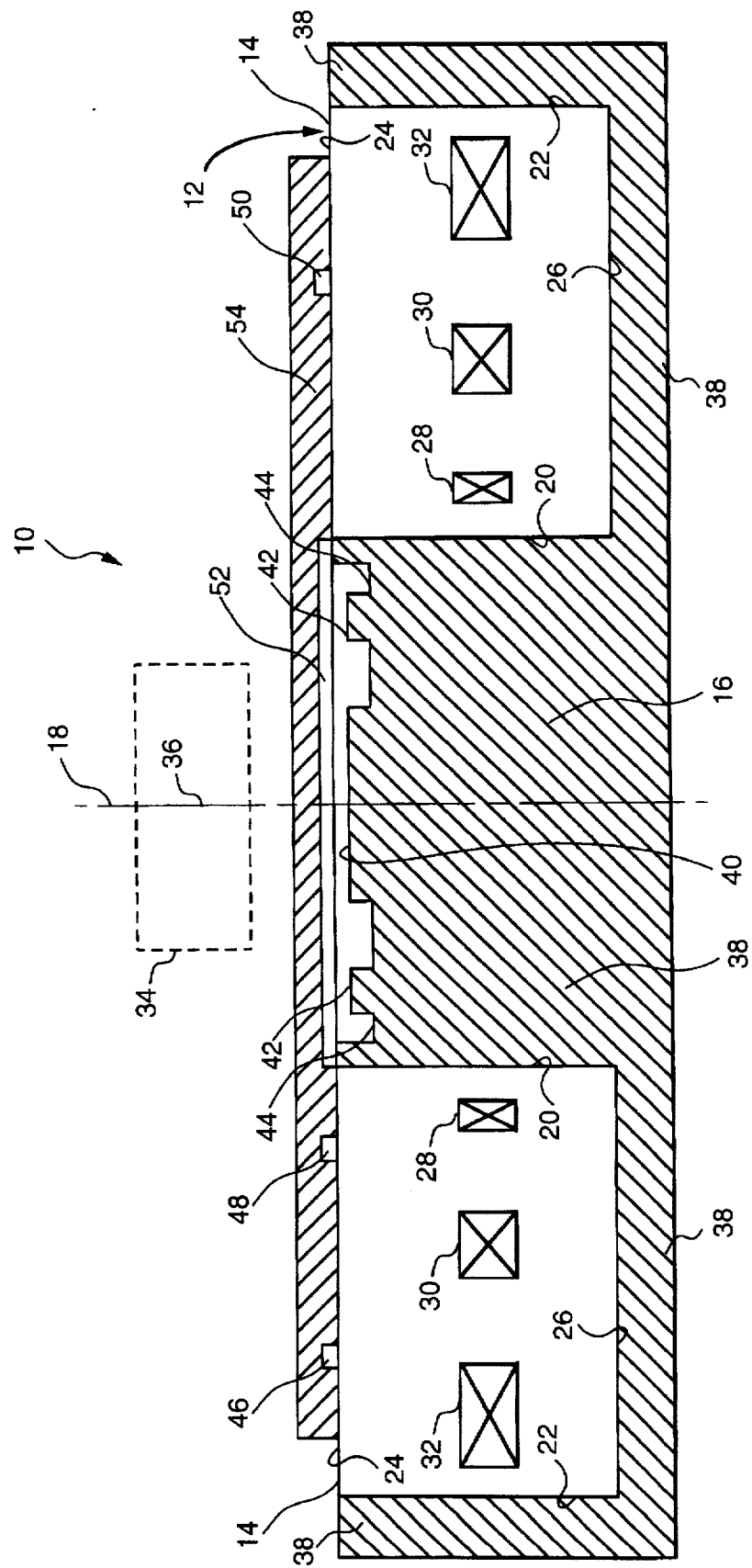

PLANAR SUPERCONDUCTING MRI MAGNET

BACKGROUND OF THE INVENTION

The present invention relates generally to a superconductive magnet used to generate a high magnetic field as part of a magnetic resonance imaging (MRI) system, and more particularly to such a magnet having a planar (i.e., flat) design for imaging specific parts of the human body.

MRI systems employing superconductive magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil. Typically, for a helium-cooled magnet, the superconductive coil assembly includes a superconductive main coil immersed in liquid helium contained in a helium dewar surrounded by two thermal shields surrounded by a vacuum enclosure.

Superconductive magnets have been mentioned in a sales brochure which claim a 15 centimeter thick pancake superconductive coil assembly magnet for breast imaging within a 10 centimeter-diameter spherical imaging volume of 1 Tesla having a pre-shim inhomogeneity of 10 parts per million (ppm) and which claim an under-the-table or behind-the-wall superconductive magnet having a 20 centimeter-diameter spherical imaging volume of 0.5 Tesla having a 10 ppm inhomogeneity with the imaging volume located outside the magnet. However, such designs have not been disclosed.

Known superconductive magnets include a pancake MRI magnet disclosed in U.S. Pat. No. 5,428,292 which utilizes several superconductive coils; with at least one coil carrying an electric current in a first direction, with at least one coil carrying an electric current in an opposite direction, and with the imaging volume centered within the magnet's bore. The imaging portion of the patient is surrounded by the magnet structure making MRI-assisted surgical and interventional procedures difficult to perform.

What is needed is a superconductive MRI magnet having an imaging volume which is not surrounded by the magnet structure.

SUMMARY OF THE INVENTION

It is an object of the invention to provide a planar superconductive MRI magnet.

The planar magnetic resonance imaging magnet of the invention has a superconductive coil assembly. The superconductive coil assembly includes: a generally toroidal-shaped coil housing; at least three spaced-apart, generally concentric and generally annular-shaped superconductive coils; and a magnetic resonance imaging volume. The housing surrounds a bore and has a generally longitudinal axis. The housing also has a radial thickness between a first generally-circumferential outside surface facing generally towards the axis and a radially spaced-apart second generally-circumferential outside surface facing generally away from the axis. The housing further has a longitudinal thickness between longitudinally spaced-apart first and second generally-annular outside surfaces facing generally away from each other. The radial thickness is greater than the longitudinal thickness. The at-least-three superconductive coils are generally coaxially aligned with the axis and positioned within the coil housing. At least one of the at-least-three superconductive coils carries an electric current in a first direction, and at least one other of the at-least-three superconductive coils carries an electric current in a direction opposite to the first direction. The at-least-three superconductive coils are the only superconductive coils located within the coil housing. The magnetic resonance imaging volume has a magnetic field strength produced predominantly by the at-least-three superconductive coils and has a center located outside the bore.

In an exemplary embodiment, the magnetic resonance imaging volume is located entirely outside the bore, and the center of the magnetic resonance imaging volume is located generally on the axis.

Several benefits and advantages are derived from the invention. Applicants' planar MRI magnet design with its magnetic resonance imaging volume located entirely outside the bore allows medical imaging of any portion of the patient without the patient being surrounded by magnet structure. Such free access to the patient allows physicians to more easily perform MRI-assisted surgical and interventional procedures.

BRIEF DESCRIPTION OF THE SOLE DRAWING

The accompanying drawing illustrates a preferred embodiment of the present invention wherein:

The FIGURE is a schematic cross-sectional side-elevational view of a preferred embodiment of the planar MRI magnet of the invention.

DETAILED DESCRIPTION OF THE INVENTION

Referring now to the drawing, the FIGURE shows a preferred embodiment of the planar magnetic resonance imaging (MRI) magnet 10 of the present invention. The magnet 10 comprises a superconductive coil assembly 12. The superconductive coil assembly 12 includes a generally toroidal-shaped coil housing 14 which surrounds a bore 16 and which has a generally longitudinal axis 18. The coil housing 14 also has a radial thickness between a first generally-circumferential outside surface 20 facing generally towards the axis 18 and a radially spaced-apart second generally-circumferential outside surface 22 facing generally away from the axis 18. The coil housing 14 further has a longitudinal thickness between longitudinally spaced-apart first and second generally-annular outside surfaces 24 and 26 facing generally away from each other. The housing's radial thickness is greater than its longitudinal thickness, and preferably the radial thickness is at least equal to generally four times the longitudinal thickness. Such superconductive coil assembly 12, as represented in the FIGURE, has a relatively flat, ring-like shape. It is noted that the bore 16 radially extends from the axis 18 to the first generally-circumferential outside surface 20 and longitudinally extends from the first generally-annular outside surface 24 to the second generally-annular outside surface 26.

The superconductive coil assembly 12 also includes at least three spaced-apart, generally concentric and generally annular-shaped superconductive coils 28, 30, and 32 generally coaxially aligned with the axis 18 and disposed within the coil housing 14. It is noted that the at-least-three superconductive coils 28, 30, and 32, thus defined, are generally coplanar. Preferably, as seen in the FIGURE, all of the at-least-three superconductive coils 28, 30, and 32 are disposed longitudinally generally midway between the first and second annular outside surfaces 24 and 26. At least one 28 and 32 of the at-least-three superconductive coils 28, 30, and 32 carries an electric current in a first direction. The first direction is defined to be either a clockwise or a counter-clockwise circumferential direction about the axis 18 with any slight longitudinal component of current direction being ignored. At least one other 30 of the at-least-three superconductive coils 28, 30, and 32 carries an electric current in a direction opposite to the first direction. Preferably, the electric currents of the at-least-three superconductive coils 28, 30, and 32 are generally equal in amperage. The at-least-three superconductive coils 28, 30, and 32 are the only superconductive coils disposed within the coil housing 14. Preferably, the at-least-three superconductive coils 28, 30, and 32 are supported on coil forms which are attached directly or indirectly to the coil housing (such coil forms and attachment being conventional and not shown in the FIGURE). The cooling of the at-least-three superconductive coils 28, 30, and 32 preferably is by a liquid cryogen (e.g., liquid helium) and/or by a cryocooler (such liquid cryogen, liquid-cryogen dewar and/or cryocooler and any required thermal shield or shields being conventional and not shown in the FIGURE).

The superconductive coil assembly 12 further includes a magnetic resonance imaging volume 34 (shown in dashed line in the FIGURE) having a magnetic field strength produced predominantly by the at-least-three superconductive coils 28, 30, and 32. The magnetic resonance imaging volume 34 has a center 36 disposed outside the bore 16. It is noted that the first generally-annular outside surface 24 of the coil housing 14 is longitudinally positioned closer to the center 36 of the magnetic resonance imaging volume 34 than is the second generally-annular outside surface 26 of the coil housing 14. Preferably, the magnetic resonance imaging volume 34 is disposed entirely outside the bore 16, and the center 36 of the magnetic resonance imaging volume 34 is disposed generally on the axis 18. As is known to those skilled in the art, a magnetic resonance imaging volume, by definition, must have a strong-enough and a homogeneous-enough magnetic field within a large-enough volume to allow magnetic resonance imaging. It is within the level of skill of the artisan, using the principles of the invention disclosed herein together with conventional magnetic field analysis, to design the at-least-three superconductive coils 28, 30, and 32 to produce such a magnetic resonance imaging volume 34 of a desired shape (such as, but not limited to, the shape of a right-circular cylinder). Thus, the particular number of superconductive coils and the direction of current flow in each depends on the particular magnetic resonance imaging volume desired.

In an exemplary enablement, the bore 16 is generally completely filled with magnetic material 38 such as, but not limited to, iron or a permanent magnet. Preferably, the magnetic material 38 also generally completely covers the second generally-annular outside surface 26 and additionally generally completely covers the second generally-circumferential outside surface 22. It is preferred that the magnetic material 38 never extend to cover any portion of the first generally-annular outside surface 24. The presence of magnetic material 38 enhances the strength and uniformity of the magnetic field within the magnetic resonance imaging volume 34 reducing the amount of superconductor required in the at-least-three superconductive coils 28, 30, and 32, which reduces the magnet's size, as can be appreciated by those skilled in the art. For a particular application, the specific thickness of the magnetic material 38 covering the second generally-annular outside surface 26 and the second generally-circumferential outside surface 22 can be determined by the artisan based on the principles of the invention disclosed herein together with conventional magnetic field analysis.

Preferably, the magnetic material 38 in the bore 16 has a generally-axisymmetric outer surface 40 generally coaxially aligned with the axis 18 and facing generally in the same direction as said first generally-annular outside surface 24. In an exemplary enablement, the generally-axisymmetric outer surface 40 has a plurality of concentric rings 42 and 44 of differing heights generally coaxially aligned with the axis 18. Such concentric rings 42 and 44 can correct for axisymmetric magnetic field inhomogeneties in the magnet design, and such concentric rings 42 and 44 can be chosen by the artisan based on the principles of the invention disclosed herein together with conventional magnetic field analysis.

Although the planar MRI magnet 10 is so designed to have a highly uniform magnetic field within the magnetic resonance imaging volume 34, manufacturing tolerances in the magnet and magnetic field disturbances caused by the environment at the field site of the magnet usually require that the magnet be corrected at the field site for such minor irregularities in the magnetic field. Typically, the magnet 10 also comprises a multiplicity of spaced-apart passive magnetic shims 46, 48, and 50 (such as pieces of iron), which are attached to the first generally-annular outside surface 24 of the coil housing 14 when the magnet 10 is at the field site, to shim the magnet 10 to a very low level of magnetic field inhomogeneity within the magnetic resonance imaging volume 34. Such passive shimming of MRI superconductive magnets is well known in the art.

Preferably, the planar MRI magnet 10 also comprises a planar gradient coil 52 (having three sub-coils) generally covering the generally-axisymmetric outer surface 40 of the magnetic material 38 in the bore 16. It is noted that time-varying-magnetic-field planar gradient coils have been conventionally placed in the magnet's bore for magnetic resonance imaging, as is known to those skilled in the art, but that the magnet 10 of the invention uses a planar gradient coil 52 outside the bore 16. In an exemplary embodiment, the magnet 10 also comprises a non-magnetic (e.g., plastic) patient contact board 54 covering: at least one of the passive magnetic shims 46, 48, and 50; at least a portion of the planar gradient coil 52; and at least a portion of the first generally-annular outside surface 24 of the coil housing 14.

In one preferred application, the axis 18 is generally vertically disposed, the patient contact board 54 is a patient support table, and the patient typically is lying down for medical imaging. In another preferred application, the axis 18 is generally horizontally disposed, and the patient typically stands (or sits) for medical imaging.

The at-least-three superconductive coils 28, 30, and 32 each typically comprise a superconductive wire or superconductive tape wound such that the coil has a longitudinal thickness (longitudinal extension) and a radial thickness (radial extension) far greater than the corresponding dimensions of the superconductive wire or superconductive tape. Preferably, a superconductive coil which is radially closer to the axis 18 than another superconductive coil has an equal or smaller longitudinal thickness and a smaller radial thickness than the other superconductive coil. Thus, the first superconductive coil 28 preferably has an equal or smaller longitudinal thickness and a smaller radial thickness than does the second superconductive coil 30. Similarly, it is preferred that the second superconductive coil 30 have an equal or smaller longitudinal thickness and a smaller radial thickness than does the third superconductive coil 32.

Applicants mathematically designed a preferred embodiment of the planar MRI magnet 10 (such design to be hereinafter described) to have a generally right-circular cylindrical imaging volume 34 which: has a magnetic field strength of generally 0.5 Tesla; has a design peak-to-peak magnetic field inhomogeneity of less than 100 parts per million (ppm); diametrically extends generally 50 centimeters; longitudinally extends generally 20 centimeters; is centered generally on the axis 18; and is longitudinally located generally 17 centimeters from the first superconductive coil 28 and generally 10.0 centimeters from the first generally-annular outside surface 24. The coil housing 14 is a vacuum enclosure with the first circumferential outside surface 20 having a diameter of generally 65 centimeters, a radial thickness of generally 90 centimeters, and a longitudinal thickness of generally 20 centimeters. The at-least-three superconductive coils 28, 30, and 32 consist of the first, second, and third superconductive coils 28, 30, and 32 each containing generally 0.10-inch wide and generally 0.05-inch thick Nb—Ti superconducting wire at a temperature of generally 4.2 Kelvin with the electric current of each of the first, second, and third superconductive coils 28, 30, and 32 having an amperage of generally 1000 amperes. The first and third superconductive coils 28 and 32 carry the electric current in the first direction, and the second superconductive coil 30 carries the electric current in the opposite direction. The first superconductive coil 28 longitudinally extends generally 6.0 centimeters, radially extends generally 4.0 centimeters, is radially disposed generally 44.0 centimeters from the axis 18, and has generally 732 meters of the wire. The second superconductive coil 30 longitudinally extends generally 6.0 centimeters, radially extends generally 8.0 centimeters, is radially disposed generally 60.0 centimeters from the axis 18, and has generally 3,666 meters of the wire. The third superconductive coil 32 longitudinally extends generally 6.0 centimeters, radially extends generally 14.0 centimeters, is radially disposed generally 100.0 centimeters from the axis 18, and has generally 11,546 meters of the wire. The magnetic material 38 covers the second generally-annular outside surface 26 to a thickness of generally 8 centimeters and covers the second generally-circumferential outside surface 22 to a thickness of generally 8 centimeters. Such magnet design was made by Applicants using the principles of the present invention, previously disclosed herein, together with conventional magnetic field analysis, as is within the skill of the artisan. The magnet 10 was conventionally cooled using a combination of liquid helium, a two-stage cryocooler coldhead, and thermal shields, such cooling being within the skill of the artisan. It is noted that the thermal shields may be constructed from copper wire composite, the vacuum enclosure may be constructed from fiber re-enforced epoxy, a stainless steel tape vapor barrier may be wound within the vacuum enclosure, and multi-layer insulation may be placed between the thermal shield and the vacuum enclosure. Such cooling and thermally-insulating structures has been omitted from the FIGURE for clarity.

It is noted that the number of superconductive coils is determined by the desired strength of the magnetic field of the magnet together with the critical current density of the superconductor used in the coils. It is further noted that in Applicants' mathematical design, an equivalent planar MRI magnet not using magnetic material 38 would require twenty percent more superconductor.

The magnet 10 of the invention provides for improved patient and physician access during MRI-guided biopsy as well as during magnetic resonance imaging. As is known to those skilled in the art, in addition to the previously discussed planar gradient coil 52, a radio frequency (RF) coil and RF shielding must be designed and operatively connected to the magnet 10 to actually perform MRI imaging.

The foregoing description of several preferred embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

We claim:

1. A planar magnetic resonance imaging magnet comprising a superconductive coil assembly, said superconductive coil assembly including:

a) a generally toroidal-shaped coil housing surrounding a bore, having a generally longitudinal axis, having a radial thickness between a first generally-circumferential outside surface facing generally towards said axis and a radially spaced-apart second generally-circumferential outside surface facing generally away from said axis, and having a longitudinal thickness between longitudinally spaced-apart first and second generally-annular outside surfaces facing generally away from each other, wherein said radial thickness is greater than said longitudinal thickness;

b) at least three spaced-apart, generally concentric and generally annular-shaped superconductive coils having generally identical temperatures, generally coaxially aligned with said axis, and disposed within said coil housing, wherein at least one of said at-least-three superconductive coils carries an electric current in a first direction, wherein at least one other of said at-least-three superconductive coils carries an electric current in a direction opposite to said first direction, wherein said housing is the only housing of said magnet containing superconductive coils, and wherein said at-least-three superconductive coils are the only superconductive coils disposed within said coil housing; and c) a magnetic resonance imaging volume having a magnetic field strength produced predominantly by said at-least-three superconductive coils and having a center disposed outside said bore.

2. The magnet of claim 1, wherein said center of said magnetic resonance imaging volume is disposed generally on said axis.

3. The magnet of claim 2, wherein said magnetic resonance imaging volume is disposed entirely outside said bore.

4. The magnet of claim 3, wherein said radial thickness is at least equal to generally four times said longitudinal thickness.

5. The magnet of claim 4, wherein said electric currents of said at-least-three superconductive coils are generally equal in amperage.

6. The magnet of claim 5, wherein said bore is generally completely filled with magnetic material.

7. The magnet of claim 6, wherein said first generally-annular outside surface of said coil housing is longitudinally disposed closer to said center of said magnetic resonance imaging volume than is said second generally-annular outside surface of said coil housing, and wherein said magnetic material also generally completely covers said second generally-annular outside surface.

8. The magnet of claim 7, wherein said magnetic material additionally generally completely covers said second generally-circumferential outside surface.

9. The magnet of claim 8, wherein:
   a) said coil housing is a vacuum enclosure with said first circumferential outside surface having a diameter of generally 65 centimeters, and wherein said radial thickness is generally 90 centimeters and said longitudinal thickness is generally 20 centimeters;
   b) said at-least-three superconductive coils consist of said first, second, and third superconductive coils each containing generally 0.10-inch wide and generally 0.05-inch thick Nb—Ti superconducting wire at a temperature of generally 4.2 Kelvin with said electric current of each of said first, second, and third superconductive coils having an amperage of generally 1000 amperes;
   c) said first and third superconductive coils carry said electric current in said first direction and said second superconductive coil carries said electric current in said opposite direction;
   d) said first superconductive coil longitudinally extends generally 6.0 centimeters, radially extends generally 4.0 centimeters, is radially disposed generally 44.0 centimeters from said axis, and has generally 732 meters of said wire;
   e) said second superconductive coil longitudinally extends generally 6.0 centimeters, radially extends generally 8.0 centimeters, is radially disposed generally 60.0 centimeters from said axis, and has generally 3,666 meters of said wire;
   f) said third superconductive coil longitudinally extends generally 6.0 centimeters, radially extends generally 14.0 centimeters, is radially disposed generally 100.0 centimeters from said axis, and has generally 11,546 meters of said wire;
   g) said magnetic material covers said second generally-annular outside surface to a thickness of generally 8 centimeters and covers said second generally-circumferential outside surface to a thickness of generally 8 centimeters; and
   h) said magnetic resonance imaging volume has a magnetic field strength of generally 0.5 Tesla, diametrically extends generally 50 centimeters, longitudinally extends generally 20 centimeters, is centered generally on said axis, and is longitudinally located generally 17 centimeters from said first superconductive coil and generally 10.0 centimeters from said first generally-annular outside surface.

10. The magnet of claim 1, wherein said bore is generally completely filled with magnetic material.

11. The magnet of claim 10, wherein said first generally-annular outside surface of said coil housing is longitudinally disposed closer to said center of said magnetic resonance imaging volume than is said second generally-annular outside surface of said coil housing, and wherein said magnetic material also generally completely covers said second generally-annular outside surface.

12. The magnet of claim 11 wherein said magnetic material additionally generally completely covers said second generally-circumferential outside surface.

13. The magnet of claim 10, wherein said magnetic material in said bore has a generally-axisymmetric outer surface generally coaxially aligned with said axis and facing generally in the same direction as said first generally-annular outside surface, and wherein said generally-axisymmetric outer surface has a plurality of concentric rings of differing heights generally coaxially aligned with said axis.

14. The magnet of claim 13, also comprising a planar gradient coil generally covering said generally-axisymmetric outer surface.

15. The magnet of claim 14, also comprising a multiplicity of spaced-apart passive magnetic shims attached to said first generally-annular outside surface of said coil housing.

16. The magnet of claim 15, also comprising a non-magnetic patient contact board covering: at least one of said passive magnetic shims; at least a portion of said planar gradient coil; and at least a portion of said first generally-annular outside surface of said coil housing.

17. The magnet of claim 1, wherein said axis is generally vertically disposed, wherein said first generally-annular outside surface of said coil housing is longitudinally disposed closer to said center of said magnetic resonance imaging volume than is said second generally-annular outside surface of said coil housing, and further comprising a non-magnetic patient support table covering at least a portion of said first generally-annular outside surface of said coil housing.

18. The magnet of claim 1, wherein said axis is generally horizontally disposed.

* * * * *